United States Patent [19]

Kuno

[11] Patent Number: 5,368,437
[45] Date of Patent: Nov. 29, 1994

[54] SUBSTRATE TRANSFER METHOD

[75] Inventor: Mitsutoshi Kuno, Sagamihara, Japan

[73] Assignee: Canon Kabushiki Kaisha, Tokyo, Japan

[21] Appl. No.: 73,290

[22] Filed: Jun. 7, 1993

Related U.S. Application Data

[63] Continuation of Ser. No. 748,816, Aug. 22, 1991, abandoned.

[30] Foreign Application Priority Data

Aug. 27, 1990 [JP] Japan .................. 2-222494

[51] Int. Cl.⁵ .................................................. B65G 49/00
[52] U.S. Cl. .................................. 414/786; 901/8
[58] Field of Search .............. 414/786, 737, 752, 627; 901/40, 8; 29/832; 269/21

[56] References Cited

U.S. PATENT DOCUMENTS

| | | | |
|---|---|---|---|
| 4,319,864 | 3/1982 | Kaufeldt | 414/750 |
| 4,451,197 | 5/1984 | Lange | 414/737 |
| 4,589,184 | 5/1986 | Asano et al. | 901/8 X |
| 4,785,528 | 11/1988 | Soderberg | 901/8 X |
| 4,874,076 | 10/1989 | Kaplan et al. | 414/737 X |

FOREIGN PATENT DOCUMENTS

| | | |
|---|---|---|
| 129731 | 1/1985 | European Pat. Off. |
| 244950 | 11/1987 | European Pat. Off. |
| 0288954 | 12/1986 | Japan .................. 901/40 |
| 2100311 | 4/1990 | Japan. |

*Primary Examiner*—Donald W. Underwood
*Attorney, Agent, or Firm*—Fitzpatrick, Cella, Harper & Scinto

[57] ABSTRACT

A method of transferring a substrate between a stage for holding a substrate thereon and a conveying hand for conveying the substrate is disclosed. In one aspect, the method includes the steps of: moving the conveying hand having the substrate held thereon to a stage attraction starting position; starting attraction, through the stage, of the substrate held by the conveying hand; moving the conveying hand to a transfer position on a side of an attracting surface of the stage remote from the stage attraction starting position; and releasing the attraction of the substrate through the conveying hand.

13 Claims, 6 Drawing Sheets

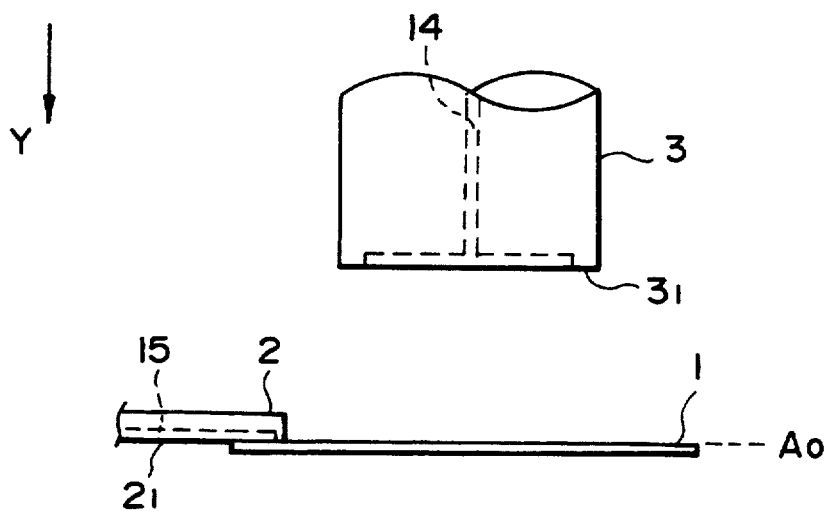
F I G. 1A
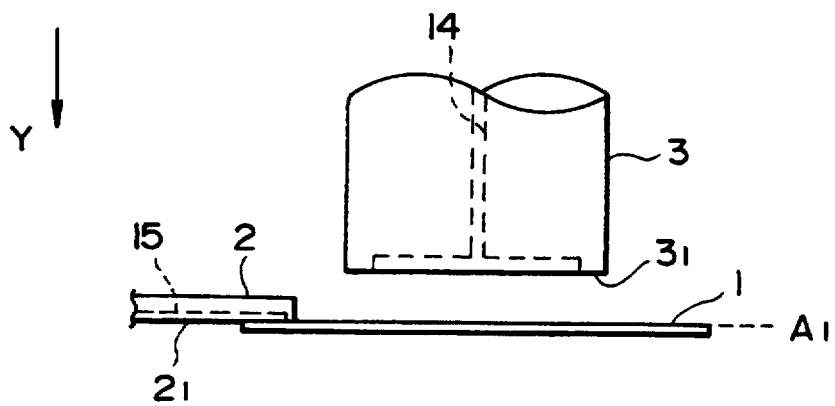
F I G. 1B
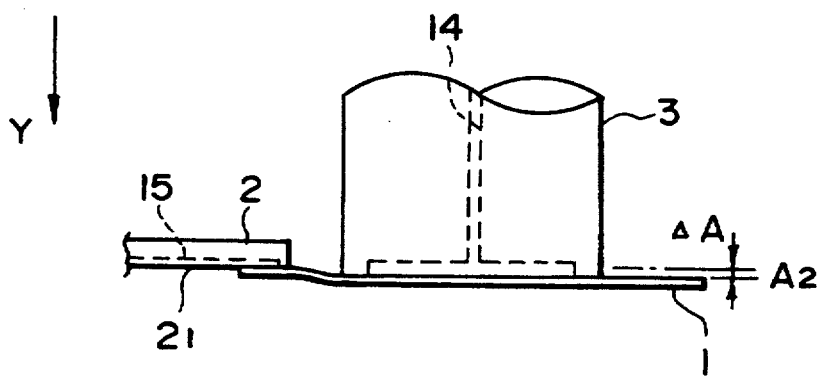
F I G. 1C

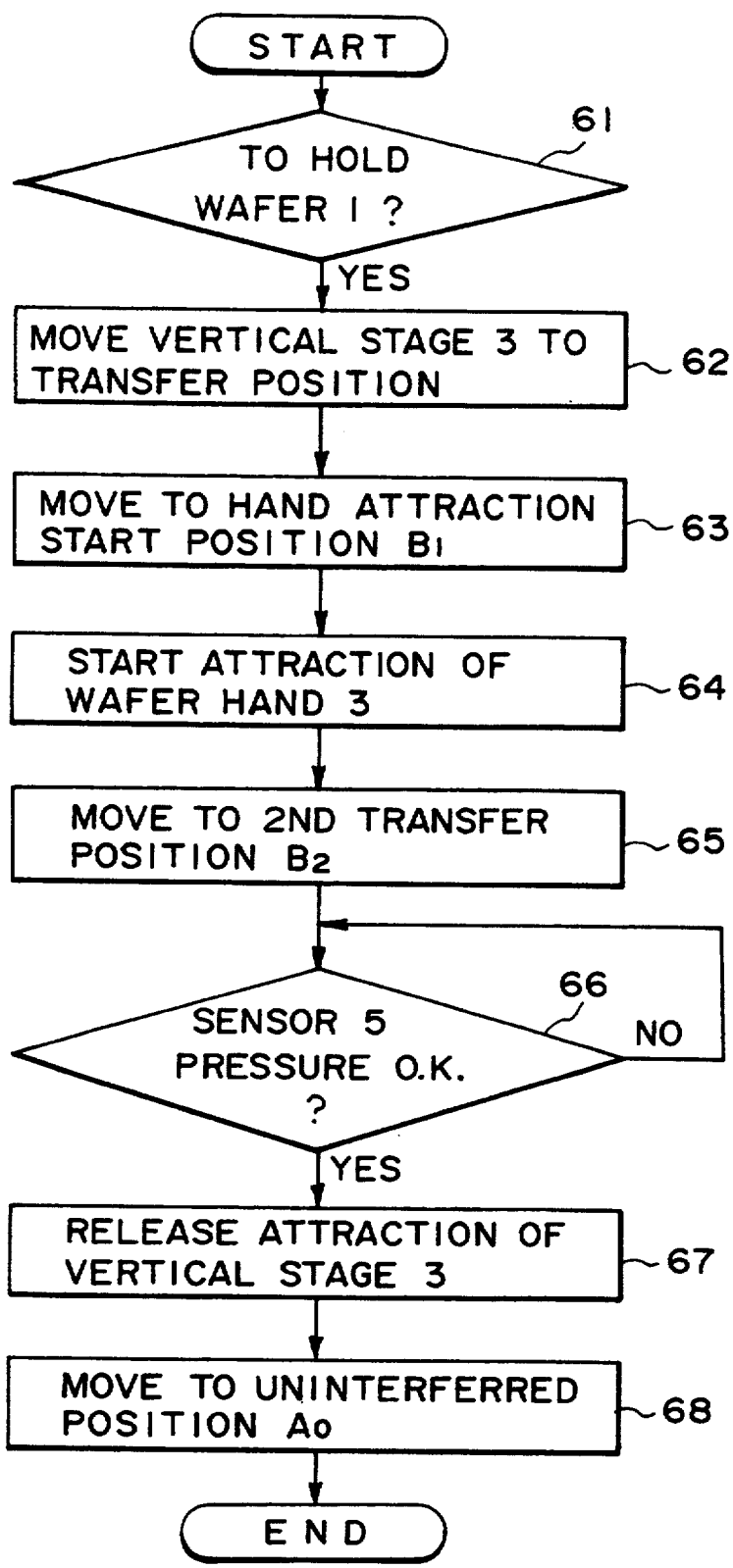
F I G. 5

SUBSTRATE TRANSFER METHOD

This application is a continuation of application Ser. No. 07/748,816, filed Aug. 22, 1991, now abandoned.

FIELD OF THE INVENTION AND RELATED ART

This invention relates to a substrate transfer method for transferring a substrate between two positions. More particularly, the invention is concerned with a substrate transfer method suitably usable in a lithographic exposure apparatus for printing semiconductor circuit patterns or the like on a substrate such as a semiconductor wafer, for example.

Conventionally, in such an exposure apparatus, a substrate is transferred between a substrate conveying hand mechanism and an exposure stage in the following manner:

(1) The conveying hand takes one of the substrates, accommodated in a container cassette, out of the cassette, with the back of the substrate being attracted to and held by the conveying hand through vacuum attraction or electrostatic attraction.

(2) The conveying hand is driven by a driving system comprising an actuator such as a pulse motor. It is controlled in response to applied pulses of a predetermined number from a controller and a driver, and is moved to a certain reference position on the stage or a position whereat the substrate contacts to an attracting face of the stage. Then, the substrate is transferred to the stage.

(3) The transfer of the substrate to the stage is discriminated through a vacuum sensor or an electrostatic sensor by checking whether the holding operation at the stage side is completed within a predetermined time period.

(4) Transfer of the substrate from the stage to the conveying hand is carried out in a similar manner.

In such a substrate transfer method, if the holding force is erroneously released before the stage holds the substrate completely, there does not occur a particular problem since in a traditional exposure apparatus, when the substrate is to be transferred, the stage is just below the substrate which is going to be transferred onto the stage.

In recent tendency of further enlargement of the capacity of a semiconductor memory, it is an important matter to further narrow the linewidth to be printed on a semiconductor substrate, and proposals have been made of an X-ray exposure apparatus which uses synchrotron radiation that contains X-rays (e.g. Japanese Laid-Open Patent Application No. 02-100311). In such X-ray exposure apparatus, it is desirable to hold a substrate such as a mask or a wafer standing so that the surface of the substrate extends substantially along a vertical plane.

Thus, in such an X-ray exposure apparatus, a standing substrate is conveyed by a substrate conveying hand in this attitude with its back attracted to the conveying hand and, while retaining this standing attitude, the substrate is transferred between a standing type stage (having a substrate holding surface which is standing) and the conveying hand.

SUMMARY OF THE INVENTION

However, if in such an X-ray exposure apparatus the transfer of the substrate between the conveying hand and the standing type stage is carried out simply in the manner described above, there arises a possibility of dropping the substrate during the transfer operation to be described below, and thus the reliability is low.

When a substrate is going to be transferred from the conveying hand to the standing type stage, the conveying hand is moved to a reference position defined on the standing type stage or a position where the substrate contacts to the attracting surface of the standing type stage, by means of a pulse motor. However, the amount of this movement is dependent upon the number of pulses applied to the pulse motor. Therefore, if the positioning precision is damaged due to an error in the pulse number, to an error in the assembling of the substrate conveying hand or to any flexure of the substrate, causing incomplete attraction of the substrate by the standing type stage, and if in this state the attraction of the conveying hand is released, then the substrate falls. This is also the case with the transfer of the substrate from the standing type stage to the conveying hand.

It is accordingly an object of the present invention to provide a substrate transfer method which assures high reliability for transfer of a substrate between a stage, particularly a standing type stage, and a substrate conveying hand.

In accordance with an aspect of the present invention, there is provided a substrate transfer method for transferring a substrate from a substrate conveying hand, for holding the substrate with its back attracted to the conveying hand, to a stage on which the substrate is to be placed, the improvements residing in the steps of: moving the conveying hand at a predetermined speed to a stage attraction starting position which is preset between an attraction surface of the stage and an uninterferred position where the substrate is opposed to the attracting surface of the stage without contact thereto; starting the attraction of the substrate through the stage; moving the conveying hand at a speed lower than the predetermined speed to a transfer position which is preset on the opposite side of the uninterferred position at a predetermined pressing distance from the attracting surface of the stage; checking the attraction of the substrate through the stage; releasing the attraction of the substrate through the conveying hand; and moving the conveying hand to a retracted position which is preset on the opposite side of the uninterferred position away from the transfer position.

In accordance with another aspect of the present invention, there is provided a substrate transfer method for transferring a substrate from a stage for holding the substrate to a substrate conveying hand for holding the substrate with its back attracted to the conveying hand, the improvements residing in the steps of: moving the conveying hand at a predetermined speed from an extracted position to a hand attraction starting position which is preset between the retracted position and an attraction surface of the stage; starting the attraction of the substrate through the conveying hand; moving the conveying hand at a speed lower than the predetermined speed to a transfer position which is preset on the opposite side of the hand attraction starting position at a predetermined pressing distance from the attracting surface of the stage; checking the attraction of the substrate through the conveying hand; releasing the attraction of the substrate through the stage; and moving the conveying hand to an uninterferred position where the substrate is opposed to the attracting surface of the stage without contact thereto.

In the first aspect, where the substrate is going to be transferred from the conveying hand to the stage, the conveying hand being moved may be once stopped at the stage attraction starting position and, after starting the attraction of the substrate through the stage, the conveying hand may be moved at a second, lower speed, to a first transfer position which may be preset on the opposite side of the uninterferred position at a first predetermined pressing distance from the attracting surface of the stage. This assures sufficient contact of the substrate being transferred to the attracting surface of the stage. Also, at the moment of the transfer, the substrate may be attracted both through the conveying hand and through the stage. Further, the attraction of the substrate through the latter onto which the substrate is to be transferred may be checked and, after this, the attraction of the substrate through the conveying hand, from which the substrate is to be transferred, may be released. This provides assured transfer of the substrate.

In the second aspect, where the substrate is going to be transferred from the stage to the conveying hand, the conveying hand being moved may be once stopped at the hand attraction starting position and, after starting the attraction of the substrate through the conveying hand, the conveying hand may be moved at a second, lower speed, to a second transfer position which may be preset on the uninterferred position side at a second predetermined pressing distance from the attracting surface of the stage. This assures sufficient contact of the substrate being conveyed to the attracting surface of the conveying hand. Also, at the moment of transfer, the substrate may be attracted both through the conveying hand and through the stage. Further, the attraction of the substrate through the former onto which the substrate is to be transferred may be checked and, after this, the attraction of the substrate through the stage, from which the substrate is to be transferred, may be released. This provides assured transfer of the substrate.

It should be noted that clearly the substrate transfer method according to the present invention is applicable to a case where the stage and/or the conveying hand is arranged to hold the substrate down.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A-1F are schematic views showing the motion of a wafer conveying hand in an embodiment of the substrate transfer method of the the present invention, wherein FIGS. 1A-1C illustrate transfer of a wafer from a wafer conveying hand to a standing type stage and FIGS. 1D-1F illustrate transfer of the wafer from the standing type stage to the wafer conveying hand.

FIG. 5 is a flow chart for explaining the operation of the control means of FIG. 3 for transfer of a wafer from the standing type stage to the wafer conveying hand.

DESCRIPTION OF THE PREFERRED EMBODIMENTS

Figure 2:
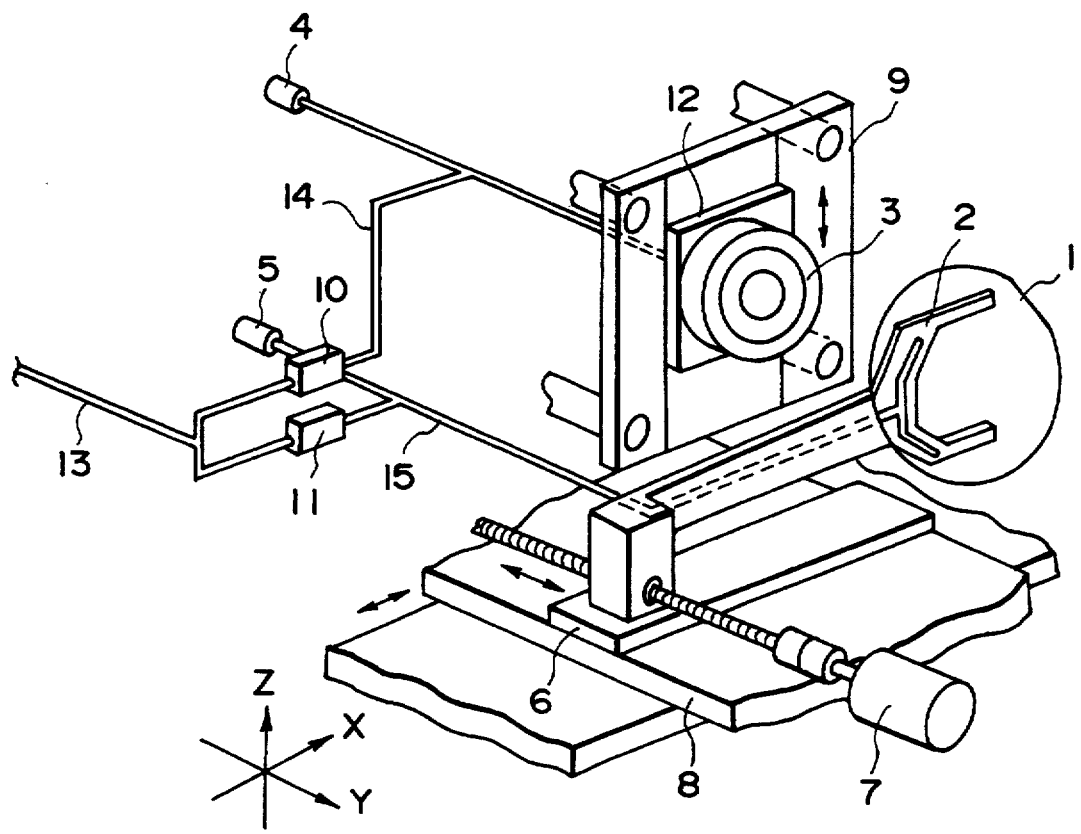
FIG. 2 is a perspective view schematically showing a substrate conveying device according to an embodiment of the substrate transfer method of the present invention.
Figure 3:
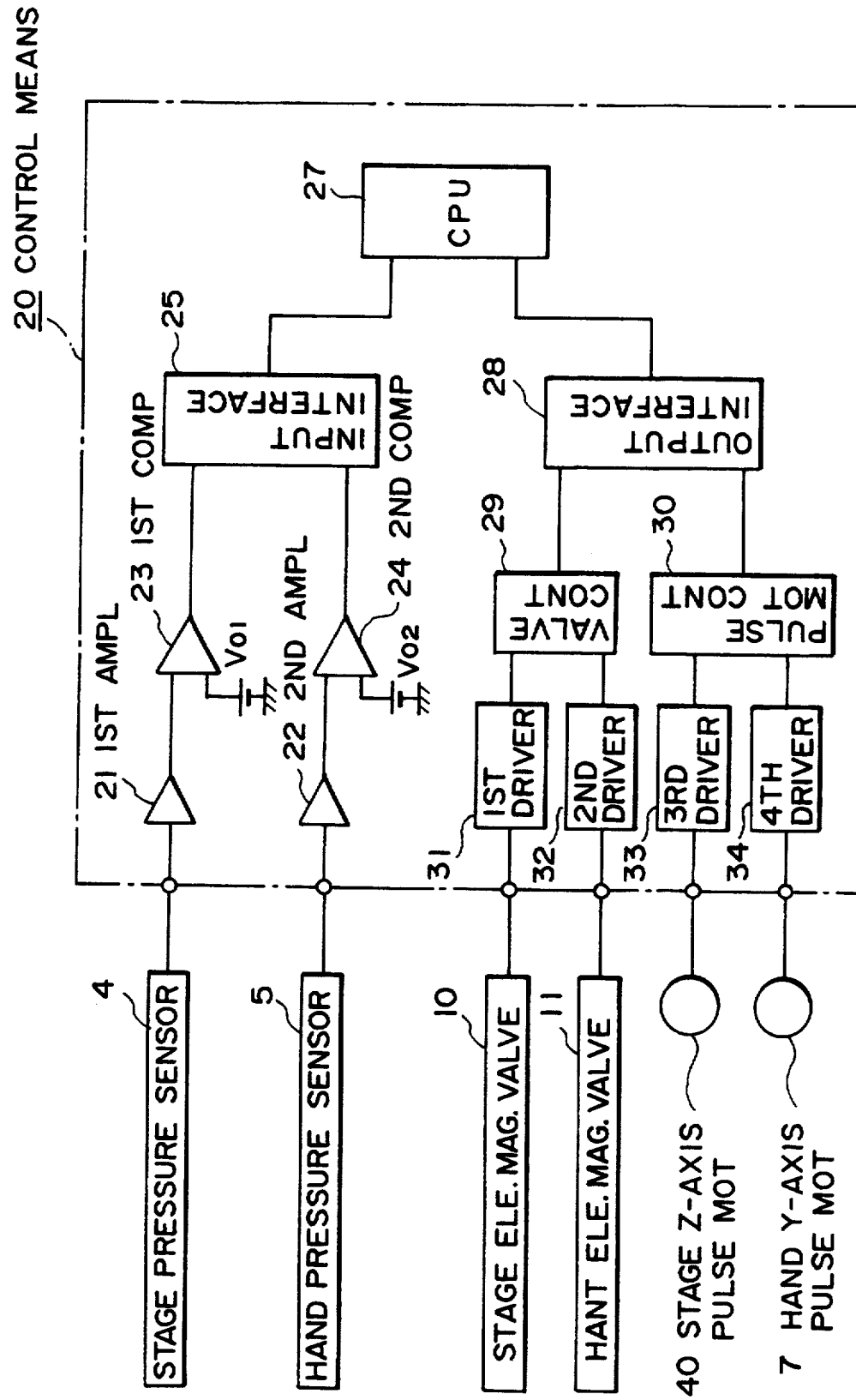
FIG. 3 is a block diagram of control means of the substrate conveying device of FIG. 2.

FIG. 2 is a schematic view of a wafer conveying device according to an embodiment of the substrate transfer method of the present invention, and FIG. 3 is a flow chart of control means 20 of the wafer conveying device of FIG. 2.

The wafer conveying device includes a wafer conveying hand (substrate conveying hand) 2 for conveying a wafer (substrate) 1 in a standing attitude (i.e. the surface of the wafer is held substantially parallel to a vertical X-Y plane), with the back of the wafer being attracted to the conveying hand; a standing type stage 3 for supporting thereon the wafer so that it is held standing (i.e. the surface of the wafer is held substantially parallel to the vertical X-Y plane); and the control means 20 shown in FIG. 3. The wafer 1 is to be transferred between the conveying hand 2 and the standing type stage 3, with the wafer being kept standing.

The wafer conveying hand 2 is mounted on a hand Y-axis support table 6 which can be reciprocally moved along the Y axis (FIG. 2) by means of a known type ball screw mechanism actuated by a Y-axis drive pulse motor 7. The Y-axis support table 6 is slidably mounted on a hand X-axis support table 8 which can be reciprocally moved along the X axis by means of a ball screw mechanism actuated by an unshown hand X-axis drive pulse motor. Thus, the wafer conveying hand 2 can be moved in the X-axis and Y-axis directions.

The standing type stage 3 is mounted on a stage Z-axis support table 12 which can be moved along the Z-axis by means of a ball screw mechanism actuated by a stage Z-axis drive pulse motor 40 (FIG. 3). The stage Z-axis support table 12 is slidably mounted on a stage base table 9 for slidable movement along the Z axis (vertical).

Pipe means 13 coupled with a vacuum source (not shown) is forked into a hand pipe means 15 and a stage pipe means 14, wherein the former is coupled with the wafer conveying hand 2 and the latter is coupled with the standing type stage 3. Thus, the wafer 1 can be held by each of the wafer conveying hand 2 and the standing type stage 3 through vacuum attraction applied from the vacuum source.

The hand pipe means 15 and the stage pipe means 14 are provided with a hand electromagnetic valve 11 and a stage electromagnetic valve 10, respectively, for control of attraction and release (non-attraction) of the wafer 1 to the wafer conveying hand 2 and to the standing type stage 3, respectively.

The hand pipe means 15 is further provided with a hand presser sensor 5 disposed between the conveying hand 2 and the electromagnetic valve 11 while the stage pipe means 14 is further provided with a stage pressure sensor 4 disposed between the stage 3 and the electromagnetic valve 10 for detection of the attracting force, to the wafer 1, of the conveying hand 2 and the stage 3, respectively.

Referring now to FIG. 3, details of the control means 20 of this wafer conveying device will be explained.

The control means 20 includes first and second amplifiers 21 and 22 for amplifying output signals of the stage pressure sensor 4 and the hand pressure sensor 5, respectively; a first comparator 23 for comparing the voltage of the output signal of the first amplifier 21 with a first reference voltage V01 and for binarizing the output signal of the first amplifiers 21; a second comparator 24 for comparing the voltage of the output signal of the second amplifier 22 with a second reference voltage V02 and for binarizing the output signal of the second amplifier 22; and an input interface 25 for inputting the output signals of the first and second comparators 23 and 24 into a microcontroller or a host computer (hereinafter "CPU") 27.

Additionally, the control means 20 includes first, second, third and fourth drivers 31, 32, 33 and 34 for actuating the stage electromagnetic valve 10, the hand electromagnetic valve 11, the stage Z-axis drive pulse motor 40 and the hand Y-axis drive pulse motor 7, respectively; a valve controller 29 for controlling the first and second drivers 31 and 32; a pulse motor controller 30 for controlling the third and fourth drivers 33 and 34; and an output interface 28 for applying the output signal of the CPU 27 to the valve controller 29 and the pulse motor controller 30.

Referring now to FIGS. 1-5, the operation of the wafer conveying device will be explained.

Figure 4:
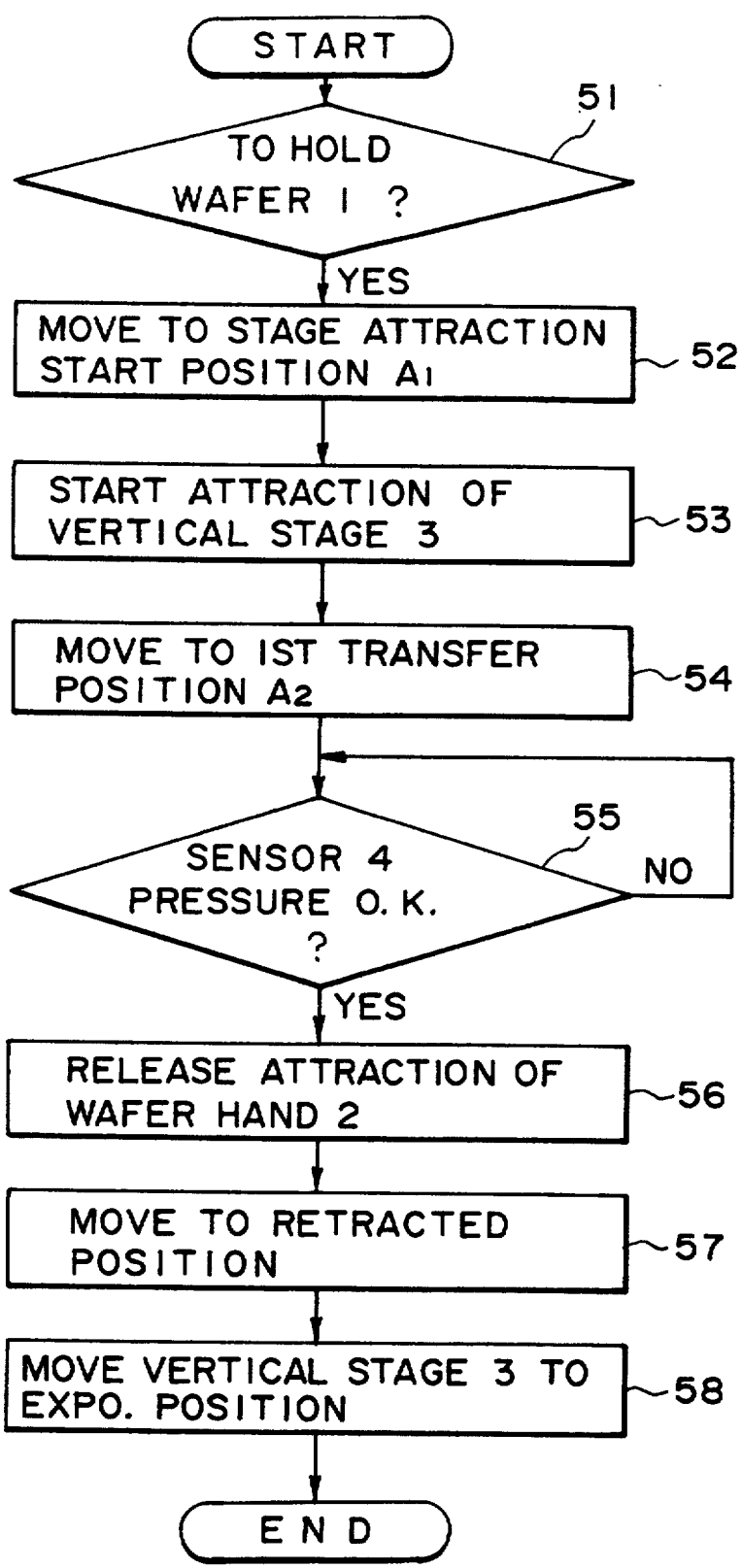
FIG. 4 is a flow chart for explaining the operation of the control means of FIG. 3, for transfer of a wafer from a wafer conveying hand to a standing type stage.

(1) Transfer of Wafer 1 from Wafer Conveying Hand 2 to Standing Type Stage 3 (FIG. 4)

First, a hand X-axis drive pulse motor (not shown) is actuated by a control means (not shown), separate from the control means 20 (FIG. 3), and the hand X-axis support table 8 of FIG. 2 is moved by a predetermined distance so as to move the wafer conveying hand 2 along the X-axis to an uninterferred position A0 (FIG. 1A) while holding a wafer 1 standing through vacuum attraction. Here, this uninterferred position A0 is preset so that the wafer when positioned is opposed to the attracting surface $3_1$ of the standing type stage 3 without contact thereto.

After the wafer conveying hand 2 is moved to the uninterferred position A0, the CPU 27 of the control means 20 reads the output signal of the hand pressure sensor 5 through the second amplifier 22, through the second comparator 24 and through the input interface 25, and it checks whether the conveying hand has held the wafer 1 (step 51), this being done on the basis of the pressure in the hand pipe means 15 as represented by the output signal of the sensor 5.

If the holding of the wafer 1 by the conveying hand 2 is discriminated, then the CPU 27 produces and applies, to the hand Y-axis drive pulse motor 7 through the output interface 28, through the pulse motor controller 30 and through the fourth driver 34, those pulses of a predetermined frequency and of a predetermined clock number as well as a signal that designates the direction of rotation. This causes the hand Y-axis support table 6 to move in the negative Y-axis direction to thereby move the conveying hand 2 to a stage attraction starting position A1 (FIG. 1B) at a first predetermined speed (step 52). Here, the stage attraction starting position A1 is preset between the uninterferred position A0 and the attracting surface $3_1$ of the stage 3 so that the back of the wafer 1 when positioned does not contact to the attracting surface $3_1$ of the stage (e.g. with a clearance of 0.3 mm between the back of the wafer 1 and the attracting surface $3_1$).

After the conveying hand 2 is moved to the stage attraction starting position A1, the CPU 27 operates through the output interface 28, through the valve controller 29 and through the first driver 31 to open the stage electromagnetic valve 10. This provides communication between the attracting surface $3_1$ of the stage and the vacuum source (not shown), and the vacuum attraction of the stage 3 to the wafer 1 starts (step 53).

As the vacuum attraction of the stage 3 to the wafer 1 starts, the CPU 27 produces and applies, to the hand Y-axis drive pulse motor 7 through the output interface 28, through the pulse motor controller 30 and through the fourth driver 34, those pulses of a frequency equal to the self-exciting frequency of the pulse motor 7 and of a predetermined clock number as well as a signal that designates the direction of rotation. This causes the hand Y-axis support table 6 to move in the negative Y-axis direction at a speed lower than the first speed, to thereby displace the attracting surface $2_1$ of the conveying hand 2 to a first transfer position A2 (FIG. 1C) (step 54). Here, the first transfer position A2 is so preset that it is on a side of the attracting surface $3_1$ of the stage 3 which side is remote from (or not opposed to) the uninterferred position A0 (i.e. above the attracting surface position as viewed in FIG. 1C), at a distance (first pressing distance) $\Delta A$ from the attracting surface $3_1$ position (e.g. $\Delta A=0.05$ mm). This ensures that the wafer 1 is pressed against the attracting surface $3_1$ of the stage.

It is to be noted here that the wafer conveying hand 2 has a rigidity of a level not causing disengagement of the wafer 1 as the conveying hand 2 moves through the first pressing distance $\Delta A$ at a speed lower than the first speed to bring the wafer 1 into press contact with the stage 3. More specifically, while in FIG. 1C the rigidity of the conveying hand 2 is illustrated with exaggeration for explaining the first pressing distance $\Delta A$, practically the conveying hand 2 has such a rigidity (with respect to the Y axis) that, when moved to the first transfer position A2, the attracting surface $2_1$ of the conveying hand 2 becomes substantially coplanar with the attracting surface $3_1$ of the stage 3. Therefore, at the position whereat the back of the wafer 1 and the attracting surface $3_1$ of the stage 3 as well as the attracting surface $2_1$ of the conveying hand 2 are in a substantially coplanar relationship, the wafer 1 is attracted through vacuum attraction to both the stage 3 and the conveying hand 2 with its back contacting the attracting surfaces $3_1$ and $2_1$ of the stage 3 and the conveying hand 2. This effectively prevents dropping of the wafer.

As the wafer conveying hand 2 is moved to the first transfer position A2, the CPU 27 reads at a predetermined timing the output signal of the stage pressure sensor 4 through the first amplifier 21, through the first comparator 23 and the input interface 25, and it checks the vacuum attraction of the stage 3 to the wafer 1 (step 55), this being done on the basis of the pressure in the stage pipe means 14 as represented by the output signal of the sensor 4.

If the vacuum attraction of the stage 3 to the wafer 1 is discriminated, then the CPU 27 operates through the output interface 28, through the valve controller 29 and the second driver 32 to close the hand electromagnetic valve 11 so as to block the communication between the attracting surface $2_1$ of the hand and the vacuum source (not shown), whereby the vacuum attraction of the wafer 1 through the conveying hand 2 is released (step 56). If, on the other hand, the pressure in the stage pipe means 14 is not at a level sufficient for holding of the wafer 1 through the stage 3, the CPU 27 repeats the reading of the pressure at a predetermined timing (step 55).

As the vacuum attraction of the wafer conveying hand 2 is released, the CPU 27 produces and applies, to the hand Y-axis drive pulse motor 7 through the output interface 28, through the pulse motor controller 30 and through the fourth driver 34, those pulses of a predetermined frequency and of a predetermined clock number as well as a signal that designates the direction of rotation. This causes additional motion of the hand Y-axis support table 6 in the negative Y-axis direction, to thereby move the conveying hand 2 to a retracted position (not shown) (step 57). Here, the retracted position is so preset that it is on a side of the first transfer position A2 which side is remote from (or not opposed to) the uninterferred position A0.

As the conveying hand 2 is moved to the retracted position, the CPU 27 produces and applies, to the stage Z-axis drive pulse motor 40 through the output interface 28, through the pulse motor controller 30 and through the third driver 33, those pulses of a predetermined frequency and of a predetermined clock number as well as a signal that designates the direction of rotation. By this, the stage 3 is moved along the Z-axis (FIG. 2) to an exposure position (step 58), for exposure of the wafer 1.

(2) Transfer of Wafer 1 from Standing Type Stage 3 to Wafer Conveying Hand 2 (FIG. 5)

First, the CPU 27 reads the output signal of the stage pressure sensor 4 through the first amplifier 21, through the first comparator 23 and the input interface 25, and it checks whether the stage 3 has held a wafer 1 (step 61), this being done on the basis of the pressure in the stage pipe means 14 as represented by the output signal of the sensor 4.

If the holding of the wafer 1 by the stage 3 is discriminated, then the CPU 27 produces and applies, to the stage Z-axis drive pulse motor 40 through the output interface 28, through the pulse motor controller 30 and the third driver 33, those pulses of a predetermined frequency and of a predetermined clock number as well as a signal that designates the direction of rotation. In response, the stage 32 is moved from the exposure position to a transfer position as illustrated in FIG. 2 (step 62).

After the stage 3 is moved to the transfer position, the CPU 27 produces and applies, to the hand Y-axis drive pulse motor 7 through the output interface 28, through the pulse controller 30 and through the fourth driver 34, those pulses of a predetermined frequency and of a predetermined clock number as well as a signal that designates the direction of rotation. This causes the hand Y-axis support table 6 to move in the Y-axis direction to thereby move the conveying hand 2, which is at the retracted position, to a hand attraction starting position B1 (FIG. 1D) at a second predetermined speed (step 63). Here, the hand attraction starting position B1 is preset so that it is on a side of the attracting surface $3_1$ of the stage 3 which side is remote from (or not opposed to) the uninterferred position A0, beyond the first transfer position A2, the back of the wafer 1 when positioned does not contact the attracting surface $2_1$ of the conveying hand 2 (e.g. with a clearance of 0.3 mm between the hand attracting surface $2_1$ position and the stage attracting surface $3_1$ position).

After the conveying hand 2 is moved to the hand attraction starting position B1, the CPU 27 operates through the output interface 28, through the valve controller 29 and through the second driver 32 to open the hand electromagnetic valve 11. This provides communication between the attracting surface $2_1$ of the conveying hand 2 and the vacuum source (not shown), and the vacuum attraction of the conveying hand 2 to the wafer 1 starts (step 64).

As the vacuum attraction of the conveying hand 2 to the wafer 1 starts, the CPU 27 produces and applies, to the hand Y-axis drive pulse motor 7 through the output interface 28, through the pulse motor controller 30 and through the fourth driver 34, those pulses of a frequency equal to the self-exciting frequency of the pulse motor 7 and of a predetermined clock number as well as a signal that designates the direction of rotation. This causes the hand Y-axis support table 6 to move in the Y-axis direction at a speed lower than the second speed, to thereby displace the attracting surface $2_1$ of the conveying hand 2 to a second transfer position B2 (FIG. 1E) (step 65). Here, the second transfer position B2 is preset so that it is on a side of the attracting surface $3_1$ of the stage 3 which side faces to the uninterferred position A0 (i.e. below the attracting surface position as viewed in FIG. 1C), at a distance (second pressing distance) $\Delta B$ from the attracting surface $3_1$ position (e.g. $\Delta B = 0.05$ mm). This ensures that the wafer 1 is pressed against the conveying hand.

It is to be noted here that the wafer conveying hand 2 has a rigidity of a level not causing disengagement of the wafer 1 as the conveying hand 2 moves through the second pressing distance $\Delta B$ at a speed lower than the second speed and contacts the wafer 1. More specifically, while in FIG. 1E the rigidity of the conveying hand 2 is illustrated with exaggeration for explaining the second pressing distance $\Delta B$, practically the conveying hand 2 has such a rigidity (with respect to the Y axis) that, when moved to the second transfer position B2, the attracting surface $2_1$ of the conveying hand 2 becomes substantially coplanar with the attracting surface $3_1$ of the stage 3. Therefore, at the position whereat the back of the wafer 1 and the attracting surface $3_1$ of the stage 3 as well as the attracting surface $2_1$ of the conveying hand 2 are in a substantially coplanar relationship, the wafer 1 is attracted through vacuum attraction to both the stage 3 and the conveying hand 2 with its back contacting the attracting surfaces $3_1$ and $2_1$ of the stage 3 and the conveying hand 2. This effectively prevents dropping of the wafer.

As the wafer conveying hand 2 is moved to the second transfer position B2, the CPU 27 reads at a predetermined timing the output signal of the hand pressure sensor 5 through the second amplifier 22, through the second comparator 24 and the input interface 25, and it checks the vacuum attraction of the conveying hand 2 to the wafer 1 (step 66), this being done on the basis of the pressure in the hand pipe means 15 as represented by the output signal of the sensor 5.

If the vacuum attraction of the conveying hand 2 to the wafer 1 is discriminated, then the CPU 27 operates through the output interface 28, through the valve controller 29 and the first driver 31 to close the stage electromagnetic valve 10 so as to block the communication between the attracting surface $3_1$ of the stage and the vacuum source (not shown), whereby the vacuum attraction of the wafer 1 through the stage 3 is released (step 67). If, on the other hand, the pressure in the hand pipe means 15 is not at a level sufficient for holding of the wafer 1 through the conveying hand 2, the CPU 27 repeats the reading of the pressure at a predetermined timing (step 66).

As the vacuum attraction of the standing type stage 3 is released, the CPU 27 produces and applies, to the hand Y-axis drive pulse motor 7 through the output interface 28, through the pulse motor controller 30 and through the fourth driver 34, those pulses of a predetermined frequency and of a predetermined clock number as well as a signal that designates the direction of rotation. This causes additional motion of the hand Y-axis support table 6 in the Y-axis direction, to thereby move the conveying hand 2 to the uninterferred position A0.

While in the embodiment described above the wafer conveying hand 2 and the standing type stage 3 are adapted to hold a wafer 1 through vacuum attraction, they may be those adapted to hold the wafer through electrostatic attraction. In that occasion, the hand pressure sensor 5 and the stage pressure sensor 4 for discrimination of the holding of the wafer through the conveying hand 2 and the stage 3 may be replaced by a hand electrostatic sensor and a stage electrostatic sensor.

Figure 1D:
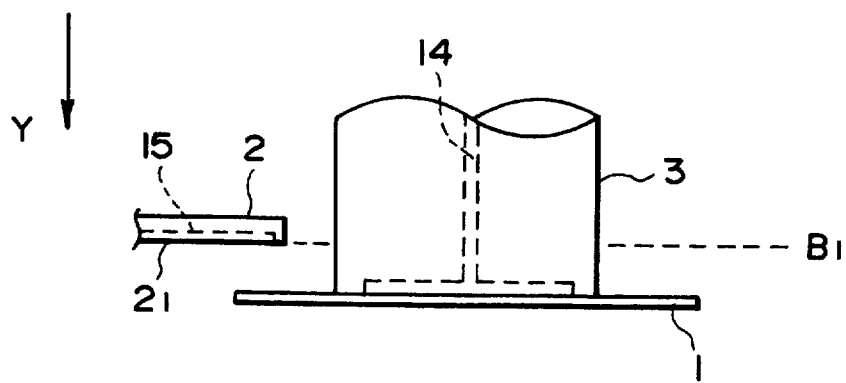
Figure 1E:
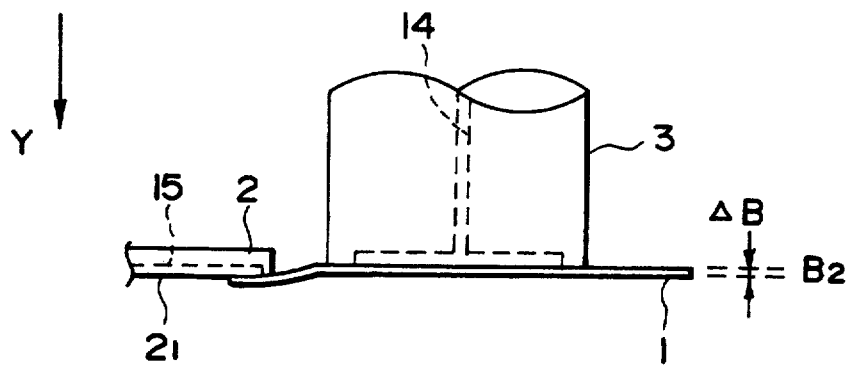
Figure 1F:
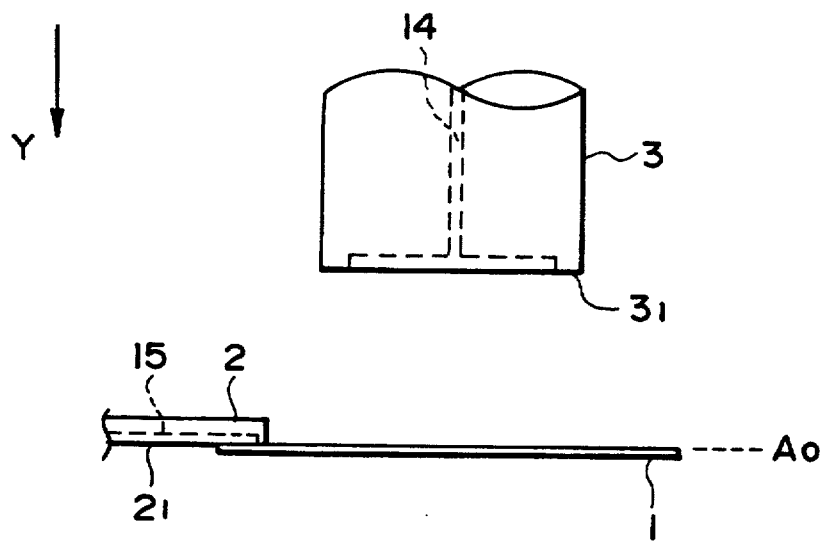

Also, the pulse motor means used for moving the conveying hand 2 or the stage 3 may be replaced by a combination of a DC motor and an encoder. However, since the stage attraction starting position A1 and the hand attraction starting position B1 shown in FIGS. 1B and 1D are only those for determining start of attraction through the stage 3 and the conveying hand, respectively, and since the first transfer position A2 and the second transfer position B2 are dependent upon the rigidity of the wafer conveying hand 2, the positioning precision as attainable with a pulse motor is sufficient for providing the required positional precision.

In the embodiment shown in FIGS. 1A–1F, a wafer 1 is transferred from and to the wafer conveying hand 2 to and from the standing type stage 3. If only it is necessary to transfer a wafer from the conveying hand 2 to the stage 3 (a separate means is used to receive the wafer from the stage 3), only the operation described with reference to steps 51–58 in FIG. 4 may be done. If, on the other hand, it is only necessary to transfer a wafer from the stage 3 to the conveying hand 2, it may be done after movement of the conveying hand 2 to its retracted position the operation described with reference to steps 61–68 in FIG. 5.

Further, the substrate transfer method of the present invention is suitably and easily applicable to such a substrate conveying system wherein a mask or a reticle is to be conveyed while holding it in a standing position, and this can be done only with small modification of the structure of the attracting surfaces $2_1$ and $3_1$ of the conveying hand 2 and the stage 3 shown in FIG. 2, to meet the attraction and holding of the mask or reticle at an outer peripheral portion of its back.

While the invention has been described with reference to the structures disclosed herein, it is not confined to the details set forth and this application is intended to cover such modifications or changes as may come within the purposes of the improvements or the scope of the following claims.

What is claimed is:

1. In a substrate transfer method for transferring a substrate from a substrate conveying hand, for holding the substrate with its back attracted to the conveying hand, to a stage having an attraction surface on which the substrate is to be placed, the method comprising the steps of:

moving the conveying hand at a predetermined speed to a stage attraction starting position which is preset between the attraction surface of the stage and an uninterferred position where the substrate is opposed to the attraction surface of the stage without contact thereto;

starting the attraction of the substrate through the stage;

moving the conveying hand at a speed lower than the predetermined speed to a transfer position which is preset on an opposite side of the attraction surface than the uninterferred position at a predetermined pressing distance from the attraction surface of the stage;

checking the attraction of the substrate through the stage;

releasing the attraction of the substrate through the conveying hand; and moving the conveying hand to a retracted position which is preset on the opposite side of the attraction surface, away from the transfer position.

2. In a substrate transfer method for transferring a substrate from a stage having an attraction surface for holding the substrate to a substrate conveying hand for holding the substrate with its back attracted to the conveying hand, the method comprising the steps of:

moving the conveying hand at a predetermined speed from an extracted position to a hand attraction starting position which is preset between the extracted position and the attraction surface of the stage;

starting the attraction of the substrate through the conveying hand;

moving the conveying hand at a speed lower than the predetermined speed to a transfer position which is preset on a side of the attraction surface opposite to the hand attraction starting position at a predetermined pressing distance from the attraction surface of the stage;

checking the attraction of the substrate through the conveying hand;

releasing the attraction of the substrate through the stage; and moving the conveying hand to an uninterferred position where the substrate is opposed to the attraction surface of the stage without contact thereto.

3. A method according to claim 1 or 2, wherein each of the conveying hand and the stage holds the substrate in a plane inclined with respect to a horizontal plane.

4. A method of transferring a substrate between a stage having an attraction surface for holding a substrate thereon and a conveying hand for conveying the substrate, said method comprising the steps of:

moving the conveying hand having the substrate held thereon to a stage attraction starting position;

starting attraction, through the stage, of the substrate held by the conveying hand;

moving the conveying hand to a transfer position on a side of the attraction surface of the stage opposite from the stage attraction starting position; and releasing the attraction of the substrate through the conveying hand.

5. A method according to claim 4, wherein, after the conveying hand is moved to the transfer position, the attraction of the substrate through the stage is checked.

6. A method according to claim 5, wherein each of the conveying hand and the stage holds the substrate in a plane inclined with respect to a horizontal plane.

7. A method of transferring a substrate between a stage having an attraction surface for holding a substrate thereon and a conveying hand for conveying the substrate, said method comprising the steps of:

moving the conveying hand to a hand attraction starting position;

starting attraction, through the conveying and, of the substrate held by the stage;

moving the conveying hand to a transfer position on a side of a substrate supporting surface of the stage opposite from the hand attraction starting position; and releasing the attraction of the substrate through the stage.

8. A method according to claim 7, wherein, after the conveying hand is moved to the transfer position, the attraction of the substrate through the hand is checked.

9. A method according to claim 8, wherein each of the conveying hand and the stage holds the substrate in a plane inclined with respect to a horizontal plane.

10. A method according to claim 4, wherein the substrate comprises a semiconductor wafer.

11. A method according to claim 9, wherein the substrate comprises a semiconductor wafer.

12. A method of transferring an article, held by attraction of first attracting means, to second attracting means, said method comprising the steps of:

moving the first attracting means relative to the second attracting means so that the article held by the first attracting means contacts an attracting surface of the second attracting means, wherein the attracting surface is inclined with respect to a horizontal plane;

causing both the first and second attracting means to attract the article;

moving the first attracting means relative to the second attracting means, while the article is being attracted to both of the first attracting means and the second attracting means such that the article is deformed thereby;

releasing the attraction of the first attracting means; and moving the first attracting means relative to the second attracting means, wherein the article is held by the attraction of the second attracting means.

13. A method according to claim 12, wherein the attraction of at least one of the first and second attracting means is provided by one of either vacuum attraction and electrostatic attraction.

* * * * *

UNITED STATES PATENT AND TRADEMARK OFFICE
CERTIFICATE OF CORRECTION

PATENT NO. : 5,368,437
DATED : November 29, 1994
INVENTOR(S) : Kuno

It is certified that error appears in the above-indentified patent and that said Letters Patent is hereby corrected as shown below: On title page, item

[56] REFERENCES CITED:

FOREIGN PATENT DOCUMENTS, "2100311 4/1990 Japan" should read --2-100311 4/1990 Japan--.

SHEET 4:

FIG. 3, "HANT" should read --HAND--.

COLUMN 11:

Line 1, "and," should read --hand,--.

Signed and Sealed this

Sixteenth Day of May, 1995

Attest:

BRUCE LEHMAN

*Attesting Officer*    *Commissioner of Patents and Trademarks*